United States Patent [19]

Healey, III et al.

[11] Patent Number: 4,578,634

[45] Date of Patent: Mar. 25, 1986

[54] APPARATUS FOR DETERMINING FREQUENCY VERSUS ACCELERATION CHARACTERISTICS FOR CRYSTALS

[75] Inventors: Daniel J. Healey, III, Baltimore; Hyo K. Hahn, Columbia, both of Md.

[73] Assignee: Westinghouse Electric Corp., Pittsburgh, Pa.

[21] Appl. No.: 771,151

[22] Filed: Aug. 29, 1985

Related U.S. Application Data

[63] Continuation of Ser. No. 499,632, May 31, 1983, abandoned.

[51] Int. Cl.$^4$ ............................................. G01R 29/22
[52] U.S. Cl. ................................... 324/56; 324/57 Q
[58] Field of Search ............................... 324/56, 57 Q

[56] References Cited

U.S. PATENT DOCUMENTS 4,467,271  8/1984  Ruckenbauer et al. .............. 324/56

Primary Examiner—Stanley T. Krawczewicz
Attorney, Agent, or Firm—J. B. Hinson

[57] ABSTRACT

The disclosed apparatus for determining the acceleration induced changes in the electrical characteristics of a quartz crystal includes all the apparatus necessary for subjecting the crystal to random acceleration forces and simultaneously determining the electrical characteristics of the crystal. More specifically a vibration generator is provided to subject the crystal under test to random vibrations of a predetermined acceleration. A low noise signal generator provides a signal at the resonant frequency of the crystal. The crystal couples the output of the low noise signal generator to a phase detector to determine the phase shift of the crystal. The output signal of the phase shift detector is analyzed to determine the acceleration versus electrical characteristics of the crystal under test.

2 Claims, 3 Drawing Figures

APPARATUS FOR DETERMINING FREQUENCY VERSUS ACCELERATION CHARACTERISTICS FOR CRYSTALS

This application is a continuation of application Ser. No. 499,632, filed May 31, 1983, now abandoned.

BACKGROUND OF THE INVENTION

1. Field of the Invention

The invention relates to test apparatus and more specifically to apparatus for determining the frequency versus acceleration characteristics of quartz crystals.

2. Description of the Prior Art

Typical prior art techniques for vibrationally testing quartz crystals to determine the magnitude of vibrational induced changes in the electrical characteristics of the crystal involved the construction of a complete oscillator of the type the crystal would be used as the frequency determining element and then vibrate in the entire circuit to determine the frequency stability of the oscillator under vibrational conditions. At best this process was relatively cumbersome and the oscillator had to be completed before the crystal was tested. Should the crystal prove defective this testing procedure required reworking the entire oscillator. Additionally it did not provide a convenient means for testing of crystals for vibrational characteristics by the crystal manufacturer prior to the shipment.

SUMMARY OF THE INVENTION

The apparatus which is the subject of this invention provides a convenient means whereby crystals may be checked for acceleration induced changes in the electrical characteristics by either the manufacturer or user without requiring the installation of the crystals to be tested in a completed circuit. More specifically the invention utilizes a vibration generator to subject the crystal to be tested to random vibrations within predetermined frequency and acceleration ranges. A low noise signal generator generates a signal at the resonant frequency of the crystal. A divider circuit divides the output signal of the signal generator into two parts with the first part being series coupled through the crystal to be tested to the first signal input terminal of a phase detector. The second portion is shifted in phased by 90° and coupled to the second input terminal of the phase detector circuit. The output signal of the phase detector is analyzed to produce signals indicative of the acceleration versus frequency response off the crystal.

DETAILED DESCRIPTION OF THE EMBODIMENT

Figure 1:
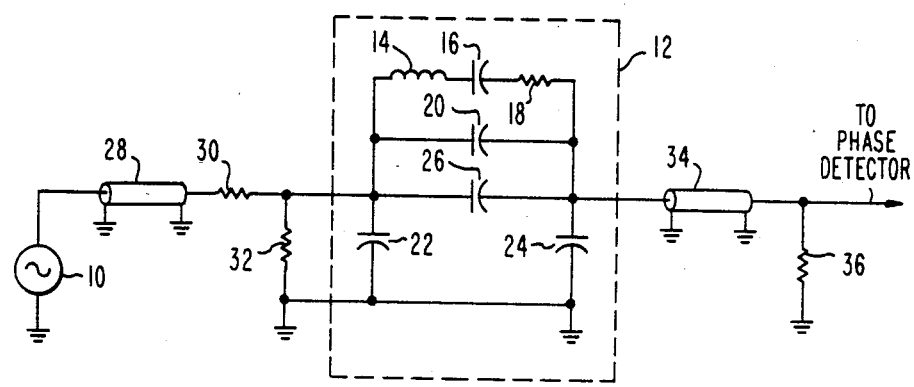
FIG. 1 is a schematic diagram illustrating the equivalent circuit of the crystal and how electrical signals are coupled to the crystal under test.

FIG. 1 is a schematic diagram illustrating the equivalent electrical circuit of a quartz crystal and the circuitry utilized to couple an RF signal from an RF signal generator 10 to the first input of a frequency discriminator. ("Crystal" is used to mean the quartz element plus its mounting or packaging structures). The crystal to be tested is represented by a network of inductors, capacitors and resistors which for purposes of illustration are enclosed in a dotted line 12. This is a conventional equivalent circuit representation of a crystal.

More specifically an inductor 14 in series with a capacitor 16 and a resistor 18 coupled in parallel with a capacitor 20 represents the quartz elements of the crystal. Other capacitances associted with the crystal mounting structures are are represented by a capacitor 22 in parallel with the input, a second capacitor 24 in parallel with the output and a third capacitor 26 in parallel with the other components representing the quartz element. From this configuration of components it is clear that changes induced in any of these components by accleration forces can change the frequency (electrical) characteristics of the crystal.

An RF input signal to the crystal 12 is provided by the signal generator 10 and coupled to one terminal of the crystal through a section of coaxial cable 28. The coaxial cable 28 is terminated in a series resistor network comprising two resistors 30 and 32. The series resistance of these two resistors should be approximately equal to the characteristic impedance of the coaxial cables 28 and in the experimental model was approximately 50 ohms. Similarly the second terminal of the crystal 12 is coupled through a second coaxial cable 34 to the input of the phase detector (not illustrated in this Figure). The second section of coaxial line 34 is also terminated in a load represented by a resistor 36 which is substantially equal to the characteristic impedance of the section of coaxial line 34. In the experimental model the load, represented by the resistor 36 was actually the input impedance of a hybrid power divider network. In the experimental model the input impedance to the hybrid power divider was also approximately 50 ohms.

Figure 2:
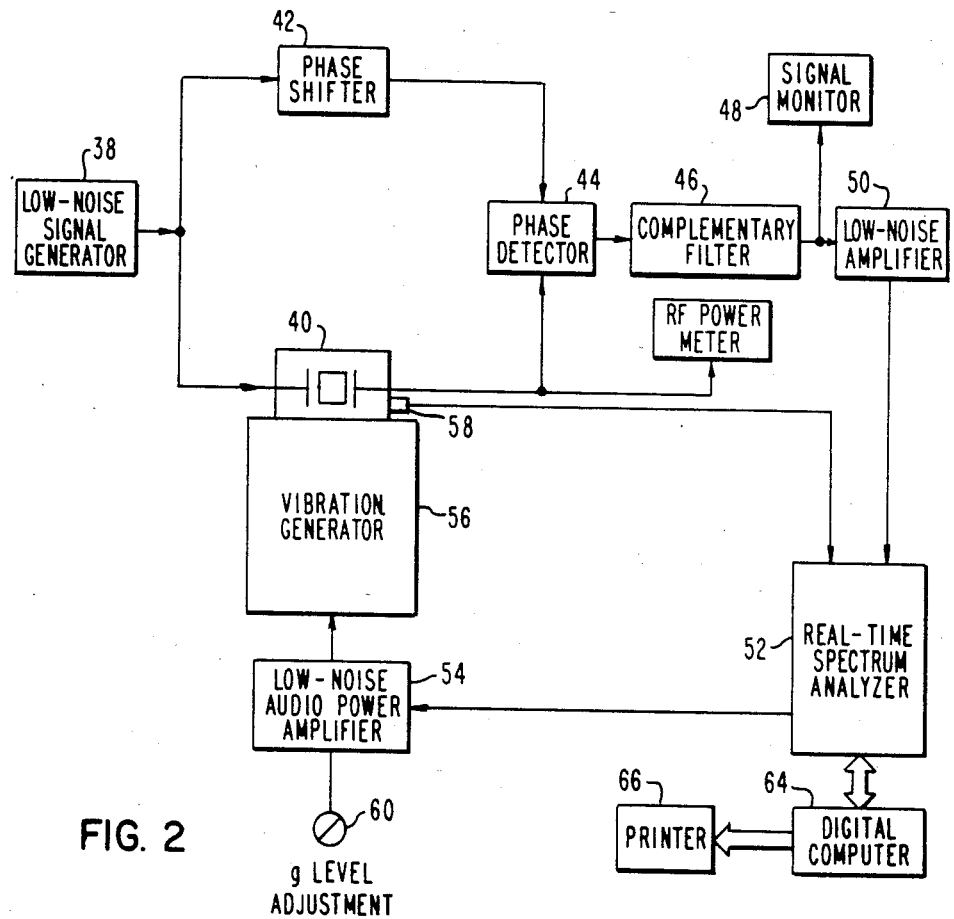
FIG. 2 is a schematic diagram of the invention.

FIG. 2 is a functional diagram of the preferred embodiment of the invention. A low noise signal generator 38 provides an output signal at the resonant frequency of the crystal 40. The output signal of the low noise generator 38 is divided into two parts with the first signal coupled to the first terminal of a crystal 40 to be tested and the second portion is coupled to the input of a phase shifter 42. A conventional doubly balanced phase detector circuit 44 has its first and second input terminals respectively coupled to the second terminal of the crystal 40 under test and the output terminal of the phase shifter 42. Under conditions of zero vibration (acceleration) the phase shifter 42 is adjusted such that the DC output voltage of the phase detector 44 is zero. As is well known this condition is achieved when the two inputs to the phase detector 44 have a constant phase difference of 90°.

The output signal of the phase detector 44 is coupled to the input terminal of a conventional complimentary filter circuit 46. The desired filtering and a subtantially constant load impedance is provided to the output of the phase detector 44 by the complementary filter 46. If desired a signal monitor such as signal monitor 48 may be utilized to monitor the output signal of the complementary filter 46. This monitor may be a DC volt meter or a conventional oscilloscope. Additionally the output signal of the complementary filter 46 is further amplified by a low noise amplifier 50. In the experimental model this amplifier had a bandwidth of approximately 50 HTZ to 1500 KHZ cycles.

A real time spectrum analyzer for example a Hewlett-Packard Model 3582A has its first input coupled to the output of the low noise amplifier 50. The spectrum analyzer 52 also generates a pseudo-random noise output signal which is coupled to the input terminal of a low noise audio power amplifier 54. Low noise audio power amplifier 54 provides a signal to drive a vibrational generator 56 which in turn vibrates the crystal 40. An accelerometer 58 is affixed to the crystal unit 40 and provides a signal to the real time spectrum analyzer 52 indicating the acceleration to which the crystal unit 40 is being subjected. An acceleration level adjustment 60 adjusts the gain of the low noise audio power amplifier 54 to assure the desired vibrational level (acceleration) for the crystal unit 40.

As described above the phase shifter 42 is adjusted such that the DC level out of the complementary filter 46 is zero volts when the vibration generator 56 is disabled. When the vibrational generator 56 is enabled to subject the crystal 40 to the desired acceleration forces any vibration induced changes in any of the elements of the equivalent crystal as shown in FIG. 1 will change the relative phase of the input signals to the phase detector 44 resulting in an output signal from the complementary filter 46 and the low noise amplifier 50. The real time spectrum analyzer 50 utilizes the output signal of the low noise amplifier 50 and the output signal of the accelerometer 58 to determine the spectrum of the output signal of the phase detector 44 and the associated acceleration and frequency. The frequency spectrum and acceleration signals from the spectrum analyzer 52 are coupled to the inputs of a digital computer 64 to calculate the acceleration versus phase or frequency characteristics of the crystal 40 under the preestablished acceleration conditions. This data is then coupled to the input terminals of a printer 66 to produce a permanent record of the electrical characteristics versus acceleration characteristics of the crystal. From this data the performance of the crystal 40 when subjected to mechanical vibrations can be predicted from the vibrational induced changes in its electrical characteristics.

Figure 3:
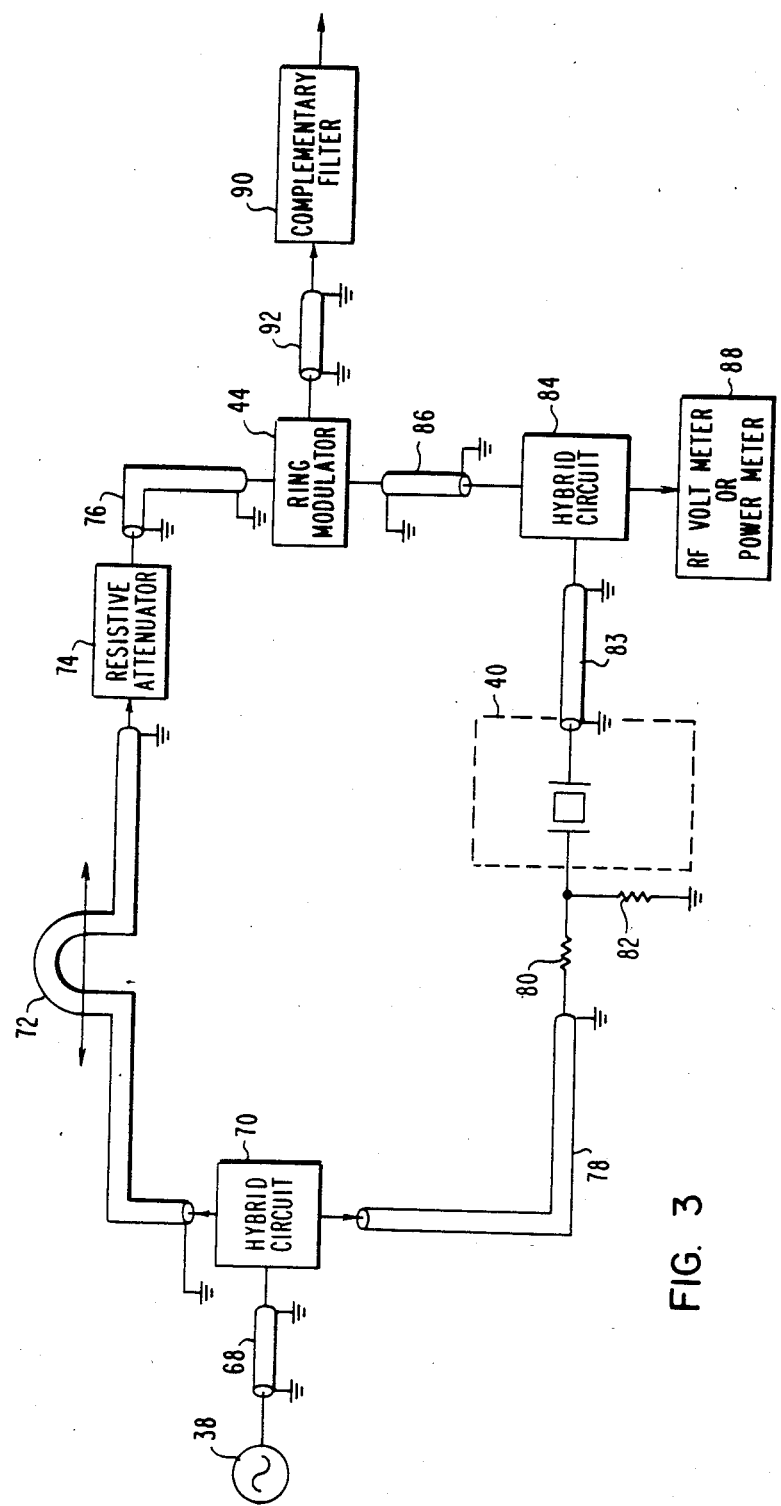
FIG. 3 is a more detailed schematic diagram of the invention.

FIG. 3 is a somewhat more detailed schematic diagram of RF portions of the system illustrated in FIG. 2. The low noise signal generator 38 is coupled by a first coaxial cable to the input of a zero phase 3 dB hybrid circuit 70. One output of the hybrid 70 is coupled to the input of a slide line phase adjuster 72 with the output of the slide-line phase adjuster 72 being coupled to the input terminal of a resistive attentuator 74. A coaxial line 76 couples the output of the resistive attentuator 74 to one input of the ring modulator (phase detector) 44. The slide line adjuster 72 and attenuator 74 respectively permit the phase and the amplitude of the input signal to the phase detector 44 to be adjusted to the desired values.

A second output terminal of the zero phase 3 dB hybrid circuit 70 is coupled to the input terminal of the crystal 40 through a coaxial line 78 and a resistive terminating network comprising series couple resistors 80 and 82 which terminate the coaxial line 78. The second terminal of the crystal 40 is coupled through a coaxial cable 83 to the input terminal of another zero phase 3 dB hybrid circuit 84. A first output of the second hybrid circuit 84 is coupled to the second input of the ring modulator (phase detector) 44 by a coaxial line 86. An indication of the magnitude of the signal coupled to the ring modulator 44 is indicated by an RF volt meter or power meter 88 which is coupled to the second output terminal of the zero phase 3 dB hybrid circuit 84 provides a convenient means to monitor the signal input to the phase detector 44.

Coupling between the output terminal of the ring modulator (phase detector) 44 and the complementary filter 90 is provided by a coaxial line 92. The output signal of the complementary filter 90 is amplified in the low noise amplifier and analyzed by the spectrum analyzer as discussed previously.

FIG. 3 as discussed above is a description of all the components of the invention having critical characteristics. That is this is a description of all of the components of the invention which operate at RF frequencies. The remainder of the components operate at much lower frequencies and are thus less critical. It will also be appreciated that the RF portion of the system illustrated in FIG. 3 can be constructed using commercially available components and conventional construction techniques. Similarly, the remainder of the system can be constructed using commercially available components. Thus, no component listing (by part number and manufacturer), is believed to be required.

The operation of the above described system is also dependent on the Q of the crystal. That is to say, the change in phase of the input to the phase detector 44 must be sufficient to produce a measurable output signal. The experimental model was successfully operated in the 100 MHZ range.

We claim:

1. A system for determining the acceleration induced changes in the electrical characteristics of a crystal, comprising in combination:
   (a) circuit means for producing first and second electrical signals each having a fixed frequency and a predetermined phase relationship therebetween;
   (b) adjustable phase shift circuit means for coupling said first electrical signal to a first input terminal of a phase detector;
   (c) circuit means for coupling said second electrical signal to a second input terminal of said phase detector through said crystal;
   (d) means for subjecting said crystal to predetermined mechanically generated acceleration forces having a random frequency within a predetermined bandwidth;
   (e) sensor means coupled to said crystal for producing a signal having a predetermined relationship to said mechanically generated acceleration forces;
   (f) means for analyzing the output signal of said phase detector and said sensor means to determine the acceleration induced changes in the electrical characteristic of said crystal.

2. A system for determining the acceleration induced changes in the electrical characteristics of a crystal, comprising in combination:
   (a) signal generator for generating an electrical signal;
   (b) phase shift means for coupling said electrical signal to a first input of a phase detector;
   (c) means for coupling said electrical signal to a second input of said phase detector through said crystal;
   (d) a vibration generator including means for affixing said crystal thereto;
   (e) an acceleration sensor coupled to said crystal to generate a signal having a predetermined relationship to the acceleration forces to which said crystal is subjected;
   (f) a real time spectrum analyzer coupled to receiver as inputs the output signals of said phase detector, said acceleration sensor and generating as outputs a pseudo random electrical signal and signals indicative of the acceleration induced response characteristics of said crystal;

(g) means for coupling said pseudo random electrical signal to said vibration generator; and (h) data processing means coupled to receive as an input said signal indicative of the acceleration induced response characteristics of said crystal and determine the relationship between the acceleration and frequency characteristic of said crystal.

* * * * *

UNITED STATES PATENT AND TRADEMARK OFFICE
CERTIFICATE OF CORRECTION

PATENT NO. : 4,578,634

DATED : March 25, 1986

INVENTOR(S) : Daniel J. Healey, III and Hyo K. Hahn

It is certified that error appears in the above-identified patent and that said Letters Patent is hereby corrected as shown below:

In the specification, column 1, page 1, beneath the TITLE the following paragraph should be added:

-- The Government has rights in this invention pursuant to Contract No. F33657-81-C0262. --

Signed and Sealed this

Ninth Day of September 1986

[SEAL]

Attest:

Attesting Officer

DONALD J. QUIGG

Commissioner of Patents and Trademarks